United States Patent
Van Vuuren et al.

(10) Patent No.: US 9,567,690 B2
(45) Date of Patent: Feb. 14, 2017

(54) PROCESS FOR THE PRODUCTION OF CRYSTALLINE TITANIUM POWDER

(71) Applicant: CSIR, Pretoria (ZA)

(72) Inventors: David Steyn Van Vuuren, Pretoria (ZA); Salomon Johannes Oosthuizen, Pretoria (ZA); Jaco Johannes Swanepoel, Pretoria (ZA)

(73) Assignee: CSIR, Pretoria (ZA)

( * ) Notice: Subject to any disclaimer, the term of this patent is extended or adjusted under 35 U.S.C. 154(b) by 248 days.

(21) Appl. No.: 14/406,166

(22) PCT Filed: May 29, 2013

(86) PCT No.: PCT/ZA2013/000038
§ 371 (c)(1),
(2) Date: Dec. 5, 2014

(87) PCT Pub. No.: WO2013/185153
PCT Pub. Date: Dec. 12, 2013

(65) Prior Publication Data
US 2015/0144055 A1    May 28, 2015

(30) Foreign Application Priority Data
Jun. 6, 2012 (ZA) .................. 2012/04134

(51) Int. Cl.
*C30B 9/04* (2006.01)
*C30B 9/00* (2006.01)
(Continued)

(52) U.S. Cl.
CPC ............... *C30B 9/00* (2013.01); *B22F 1/0007* (2013.01); *B22F 3/24* (2013.01); *C30B 29/02* (2013.01)

(58) Field of Classification Search
CPC ................ B22F 1/00; C30B 9/04; C30B 9/06; C30B 9/10
See application file for complete search history.

(56) References Cited

U.S. PATENT DOCUMENTS

| | | | |
|---|---|---|---|
| 2,846,303 | A | 8/1958 | Keller et al. |
| 5,259,862 | A | 11/1993 | White et al. |

(Continued)

FOREIGN PATENT DOCUMENTS

WO    WO 2011/106804    9/2011

OTHER PUBLICATIONS

Okabe, et al., "Metallothermic reduction as an electronically mediated reaction", Journal of Materials Research, vol. 13, No. 12, Dec. 1998.
(Continued)

*Primary Examiner* — Robert M Kunemund

(57) ABSTRACT

The invention provides a process for the production of crystalline titanium powder containing single crystals or agglomerates of single crystals having an average crystal size (by volume) greater than 1 μm, said process including reacting a titanium chloride species, preferably titanium dichloride, and reducing metal in a continuous back-mix reactor to produce a free flowing suspension of titanium powder in molten chloride salt wherein: i. both the titanium chloride species and the reducing metal are dissolved in a molten chloride salt and fed to the reactor containing a chloride salt of the reducing metal; ii. the average feed ratio of the titanium chloride species and reducing metal to the continuous back-mix reactor is within 1%, preferably within 0.1%, of the stoichiometric ratio required to fully reduce the titanium chloride salt to titanium metal; iii. the concentration of titanium powder in the fluid suspension of titanium powder in molten salt in the continuous back-mix reactor is (Continued)

between 2 and 23 mass %; and iv. The reducing metal is lithium, sodium, magnesium, or calcium.

19 Claims, 1 Drawing Sheet

(51) Int. Cl.
  *B22F 1/00* (2006.01)
  *B22F 3/24* (2006.01)
  *C30B 29/02* (2006.01)

(56) References Cited

U.S. PATENT DOCUMENTS 6,001,326 A * 12/1999 Kim .................. C01G 23/0536
  423/598
8,926,938 B2 * 1/2015 Sun ..................... H01M 4/0471
  423/611

OTHER PUBLICATIONS

Suzuki, et al., "Titanium powder prepared by magnesiothermic reduction of TI2+ in molten salt", Metallurgical and Materials Transactions Science, vol. 30B, No. 3, Jun. 1999.

* cited by examiner

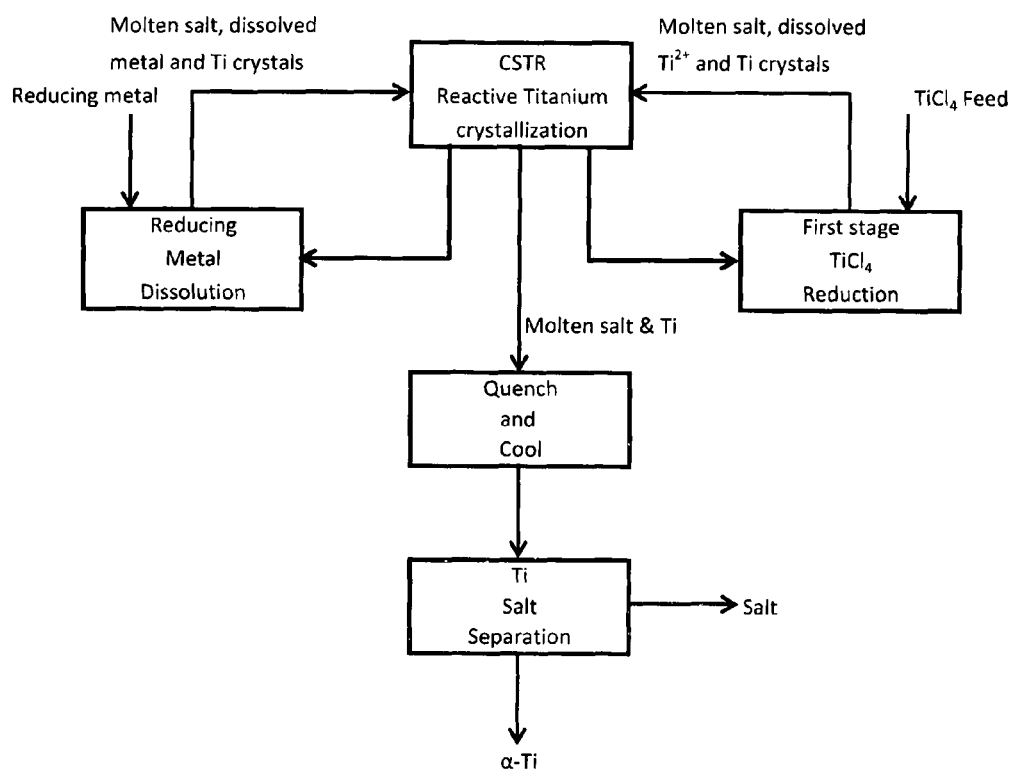

PROCESS FOR THE PRODUCTION OF CRYSTALLINE TITANIUM POWDER

CROSS REFERENCE TO RELATED APPLICATIONS

This application is the National Stage of International Application No. PCT/ZA2013/00038, filed on May 29, 2013, which claims the benefit of South African Application No. 2012/04134, filed on Jun. 6, 2012. The contents of both applications are hereby incorporated by reference in their entirety.

FIELD OF THE INVENTION

The invention relates to the production of crystalline titanium powder.

BACKGROUND TO THE INVENTION

One of the first attempts to produce titanium crystals is described in the patent by Keller and Zonis (1958). Keller and Zonis realized the importance of slow, stepwise reduction of titanium chloride species to obtain crystalline titanium.

Keller and Zonis also stressed the importance of uniformly distributing the reducing agent to avoid localized portions in the salt reaction medium where the titanium is rapidly reduced forming titanium fines.

White and Oden described a process to produce granular Ti metal free of halide inclusions that entails reacting a stream consisting of Na, Mg, Li or K dissolved in a halide salt of the respective metal in a continuous stirred tank reactor with a stream consisting of a halide salt stream containing a halide salt of Ti. Although the intent of the process is to provide conditions that allow orderly growth of titanium metal, the importance of key factors to achieve such conditions were not realized, e.g.: the need to ensure low concentrations of both dissolved reducing metal and dissolved titanium halide in the reactor (which is achieved by feeding the reactants near stoichiometrically and providing a relatively long residence time in the reactor), the advantage of feeding the two reacting components as dilute streams, maintaining a high concentration of titanium crystals in the reactor to enhance growth of such titanium crystals relative to the formation of new titanium crystal nuclei, the benefit of preparing the feed stream containing the titanium halide feed by reducing $TiCl_4$ with an excess of titanium particles suspended in a molten halide salt stream and the need to prevent uncontrolled reduction of titanium chloride via Long Range Electronically Mediated Reduction (LR-EMR) which is described in J. Mater. Res., Vol. 13, No. 12, December 1998, 3372 to 3377. Furthermore, the need to avoid high operating temperatures that can lead to partial sintering of titanium crystals forming clusters that might contain encapsulated halide salt was not realised and the process instead taught the advantage of using high operating temperatures to increase the solubilities of the different reacting species in molten halide salt.

The present invention differs from the prior art in that it optimizes a combination of diverse requirements needed to achieve conditions to produce and grow crystalline titanium metal particles in a continuous manner.

SUMMARY OF THE INVENTION

According to the invention, there is provided a process for the production and control of the growth of titanium crystals in a continuous metallothermic $TiCl_4$ reduction process.

Thus, according to the invention, there is provided a process for the production of crystalline titanium powder containing single crystals or agglomerates of single crystals having an average crystal size (by volume) greater than 1 μm, said process including reacting a titanium chloride species, preferably titanium dichloride, and reducing metal in a continuous back-mix reactor to produce a free flowing suspension of titanium powder in molten chloride salt wherein:

i. both the titanium chloride species and the reducing metal are dissolved in a molten chloride salt including suspended titanium powder and fed to the reactor containing a chloride salt of the reducing metal, ii. the average feed ratio of the titanium chloride species and reducing metal to the continuous back-mix reactor is within 1%, preferably within 0.1%, of the stoichiometric ratio required to fully reduce the titanium chloride salt to titanium metal;

iii. the concentration of titanium powder in the fluid suspension of titanium powder in molten salt in the continuous back-mix reactor is between 2 and 23 mass %; and iv. The reducing metal is lithium, sodium, magnesium, or calcium.

Some molten salt and titanium powder product may be withdrawn together from the continuous back-mix reactor and separated from each other outside the reactor.

The feed of the dissolved titanium chloride species may be produced in a separate vessel external to the continuous back-mix reactor, preferably by reacting $TiCl_4$ with metallic titanium dispersed in molten chloride salt recycled from the continuous back-mix reactor.

The reducing metal may be pre-dissolved in molten chloride salt prior to feeding to the continuous back-mix reactor, preferably by recycling molten salt from the continuous back-mix reactor to a vessel where the reducing metal is dissolved in the chloride salt.

The vessels to produce the dissolved titanium chloride salt and the dissolved reducing metal may be electrically isolated from each other and also from the continuous back-mix reactor.

The molar concentration of dissolved titanium cations of the titanium chloride salt may be less than 25%, preferably less than 5%, of the molar concentration of chloride anions in the molten salt feed solution.

The molar concentration of dissolved reducing metal atoms in the molten chloride salt feed may be less than 3.5%, preferably less than 0.5% of the chloride anions of the molten salt solution.

The feed of dissolved reducing metal to the continuous back-mix reactor may be in excess of the stoichiometric requirement to reduce all the titanium sub-chloride in the feed to the continuous back-mix reactor.

The temperature of the continuous back-mix reactor may be less than 800° C., typically less than 700° C., preferably less than 650° C.

The residence time in the reactor may be expressed as a ratio of the volume of titanium powder inside the continuous back-mix reactor to the volumetric rate of titanium powder produced in the continuous back-mix reactor, and may be more than five minutes, preferably more than twenty minutes.

There may be an excess of dispersed titanium recycled to the vessel producing the dissolved titanium halide species relative to the stoichiometric requirement to fully reduce the TiCl$_4$ feed to titanium dichloride.

Advantages of the Invention

Titanium blockages in the TiCl$_4$ feed lines can be formed via LR-EMR of Titanium Chloride Species by the reducing metal (Li, Na, Mg or Ca). This may be prevented by firstly feeding the TiCl$_4$ into a pre-reduction reactor that is not sufficiently reducing to cause the reduction of any titanium chloride species to titanium metal.

When TiCl$_4$ is reduced using a reducing metal such as an alkali or alkali earth metal to produce sub-chlorides, it is possible that titanium metal can be formed if excess reducing metal is used, or if free alkali or alkali earth metal is in contact with the metal construction in contact with the TiCl$_4$ inlet. When reducing titanium chloride species with metallic titanium, only lower valence titanium sub-chlorides may be formed.

The process may include the breaking of electrical contact and/or salt bridge/s between the first stage TiCl$_4$ pre-reduction zone, the final reduction zone and/or the reductant dissolution zone otherwise electrochemical reduction of titanium tetrachloride and subchlorides to titanium can occur via LR-EMR if the first stage pre-reduction reactor is electrically and ionically coupled to any zone in the overall process where alkali- or alkali earth metal is present.

Lumps of titanium sponge adhering to reactor walls or internals can also be caused by LR-EMR effects. This may be drastically reduced if electrical contact between undissolved reducing metal and the reactor walls and internals are broken to prevent electron flow to areas containing titanium sub-chlorides. Theoretically, dissolved reducing metal can also cause formation of titanium sponge, but the electronic conductivity of molten salt containing dissolved reducing metal is orders of magnitude lower than that of molten reducing metal, so that dissolved (or dispersed) reducing metal is therefore not as problematic.

The final titanium sub-chloride reduction stage may be operated at conditions where the concentration of dissolved reducing metal is deliberately kept low. The lower the concentration of reducing metal, the lower the chemical driving force for the formation of titanium metal and also the lower the electronic conductivity of the molten salt that contributes to electrical contact between dissolved reducing metal and metal of construction of the reactor.

Both the TiCl$_4$ pre-reduction stage and the final titanium subchloride reduction reactor may be operated under conditions where the concentration of dissolved titanium cations is deliberately kept low. The lower the concentration of dissolved titanium cations, the lower the chemical driving force for the formation of titanium. Residual titanium subchloride dissolved in the reaction medium is undesirable in downstream titanium product recovery steps because it can contaminate the product upon the reaction with water to form titanium dioxide, hydrochloric acid and hydrogen.

The titanium crystallization reactor may be operated at conditions where there is a high concentration of suspended titanium crystals in the molten salt. Without dilution with additional salt fed to the titanium crystallization reactor, the maximum achievable is 1 mole of titanium metal per four moles of chloride ions in the salt. Dilution should preferably be avoided or minimized. The rate of crystal growth is directly proportional to the total surface area of crystals present in the reactor; hence the presence of crystals enhances the rate of crystal growth relative to crystal nucleation. Furthermore, the presence of suspended titanium particles enhances the possibility of crystalline titanium forming. The deliberate maintaining of a presence of seed crystals is a vital practise in reactive crystallisation where seed crystals serve to significantly reduce local concentration of reagents and provides surfaces for crystal growth vs. nucleation of fine particles. Seeding is considered key to achieving control of a reactive crystallisation process, without seeding excessive nucleation would occur and final particle size would be severely limited.

The two feed streams used by the process (TiCl$_4$ and reducing metal) may be fed to the process near stoichiometrically (or as close as possible to the stoichiometric ratio). In practise this will be between 0.5% excess reducing metal and 1% excess TiCl$_4$. At exact stoichiometric feeds and long residence times, the concentrations of both dissolved titanium cations and reducing metal atoms will become very low and approach thermodynamic equilibrium in the final titanium subchloride reduction reactor. As mentioned, low concentrations (near zero) favour crystal growth relative to crystal nucleation. Known methods in the field of reactive crystallization to enhance particle or crystal growth such as recycling large amounts of seed crystals, introducing the feed streams to the CSTR (Continuous Stirred Tank Reactor, also referred to as a Continuous Flow Stirred Tank Reactor or as a continuous back-mix reactor) near the eye of the impeller used to agitate the reactor, increased agitation power, or different types of agitator design or ultrasonic stirring may additionally be employed.

The final titanium subchloride reduction reactor may be operated and controlled near stoichiometrically, but with a slight excess of reducing metal. By operating the final titanium subchloride reduction reactor near stoichiometrically, the concentrations of both titanium cations and dissolved reducing metal may be minimized. Unstable dissolved titanium atoms can form when dissolved titanium cations are reduced and these atoms can either combine with each other to form new titanium nuclei or can be incorporated in existing titanium crystals forming larger crystals. The rate of crystal growth relative to that of nucleation is increased with lower concentrations of species forming the crystals. It is therefore considered to be more advantageous to operate the titanium crystallizer at lower titanium cation concentrations and slightly higher dissolved reducing metals concentrations than the other way round.

Slight excess of reducing metal will also serve to reduce residual titanium sub-chloride dissolved in the reaction medium which is undesirable in downstream titanium product recovery steps because it can contaminate the product upon the reaction with water to form titanium dioxide, hydrochloric acid and hydrogen:

$$TiCl_2 + 2H_2 \leftrightarrow TiO_2 + 2HCl + H_2$$

The residence time in the final titanium subchloride reduction reactor must be sufficiently long to ensure the desired particle or crystal growth, typically at least 5 minutes as discussed above. The longer the residence time in the reactor, the lower the final concentrations of dissolved reducing metal and titanium cations. The lower these concentrations, the higher the relative rate of crystal growth to crystal nucleation. However, the longer the residence time, the larger the reactor and the greater the difficulty to achieve rapid mixing of feed streams into the reactor contents. Optimal residence time vs. reactor size and recycle streams are being determined.

The reducing metal may be fully dissolved in the salt prior to being fed into the final titanium subchloride reduction reactor at concentrations below 1 molar percent and preferably less than 0.4 mole % (Entrained droplets of reducing metal may however be present, but should be minimized). Whereas ideal, perfect mixing of any real reaction vessel is theoretically impossible to achieve and becomes increasingly difficult the larger the reactor or the longer the residence time inside the reactor, localized zones of high reactant concentrations will lead to excessive nucleation of titanium particles. Furthermore, the solubility of magnesium is only about 0.15 mole % in molten $MgCl_2$ and that of Li about 0.5 mole % in molten LiCl. Consequently higher concentrations of reducing metals dissolved in their chloride salt can not be achieved without raising the temperature of the process significantly, and in the case of sodium this easily approaches the boiling point of the metal. This feature advocates a process that operates at lower temperatures and concentrations compared to prior art where reagent concentrations were increased for higher throughput.

Large recycle flow rates to the $TiCl_4$ pre-reduction reactor and reducing metal dissolution step may be used to dilute feed streams to the final titanium subchloride reduction reactor. The concentration of titanium cations in the feed to the final titanium subchloride reduction stage may also be reduced as much as is practically feasible. Preferably, there must be less than one titanium cation ($Ti^{2+}$ or $Ti^{3+}$) dissolved in the salt per four moles of chloride anions in the salt solution. Preferably this ratio must be less than 1:8 and more preferably it should be less than 1:16 (Ratios to be confirmed). In addition, especially when using sodium or calcium as reducing metal, the recycle stream to the reducing metal dissolution stage is preferably increased to reduce the concentration of sodium or calcium.

The dissolved metal concentration in the feed should preferably be below 2 mole % when using sodium or calcium as reducing agent, below 0.5 mole % when using lithium and below 0.15% when using magnesium as reducing metal.

Excess titanium particles or crystals may be recycled to the first stage $TiCl_4$ pre-reduction reactor. Some of the titanium cations ($Ti^{2+}$ and $Ti^{3+}$) might absorb onto the surfaces of the excess titanium crystals. When these particles are re-introduced into the final titanium subchloride reduction stage, rather than forming new titanium nuclei, it is expected that upon being reduced, the absorbed cations will be incorporated into the existing titanium crystals on which they are absorbed.

The final titanium subchloride reduction stage may be operated at temperatures as low as practically feasible. Apart from issues of corrosion and similar standard difficulties with high temperature processing, a further problem with increased temperatures is sintering of titanium particles that in the presence of molten salt may cause some of the salt to be encapsulated in voids of sintered agglomerates. It becomes difficult if not impossible to remove this salt from the particles without expensive melting operations, and hence the stringent requirement of making titanium powder with a very low chloride content becomes difficult (e.g. 0.005 mass %).

There is not an exact temperature where titanium crystals begin to sinter, although it has been reported that noticeable sintering happens at temperatures from 750° C. Without the addition of additional chloride salts to form eutectics, the absolute minimum temperature at which the process can work is the melting point of the chloride salt of the reducing metal. The respective melting points of the chloride salts of what is considered the four most feasible reducing metals are 610° C. for LiCl, 801° C. for NaCl, 714° C. for $MgCl_2$ and 775° C. for $CaCl_2$. In practise the minimum operating temperature is about 20° C. higher than the salt melting point. As can be seen, from the perspective of minimizing sintering, lithium is the most appropriate reducing metal with magnesium second best (about 104° C. higher temperature).

Excess titanium particles may be present in the first stage $TiCl_4$ pre-reduction reactor. Although the reaction of $TiCl_3$ with Fe to form $TiCl_2$ and $FeCl_2$ is not very favourable, at typical operating temperatures of the process, it becomes more favourable in the presence of molten salt into which the products of the reaction can dissolve. This can lead to excessive contamination of the titanium product. In order to reduce the extent of iron contamination, it is necessary to reduce the oxidation potential of the contents of the $TiCl_4$ pre-reduction reactor by having free metallic titanium particles in the salt so that $TiCl_3$ is reduced with Ti to form $TiCl_2$. $TiCl_2$ is much less oxidizing than $TiCl_3$.

This deliberate maintaining of free metallic titanium particles in the first stage $TiCl_4$ pre-reduction reactor can occur via recycling of titanium product from the final stage reduction reactor or via addition of titanium metal (e.g. scrap).

The process may be operated at as low temperatures as practically feasible. The lower the temperature, the lower the rate of oxidation of iron and the lower the thermodynamic driving force for oxidizing iron with dissolved $TiCl_3$ to form dissolved $FeCl_2$ in molten salt.

Lower temperatures limit salt evaporation. Salt that evaporates in the high temperature parts of the reactor deposits in colder sections of the reactor (i.e. in off gas lines) leading to blockages. Additional measures must be taken to remove such deposits. The estimated vapour pressures of different chloride salts at 20° C. above the melting points of the salts are given in the Table 1.

TABLE 1

Salt Vapour Pressures at 20° C. Above the Salt Melting Point

| Salt | M.P. (CC) | M.P. + 20 (CC) | Pvap@ M.P. = 20° C. (Pa) |
|---|---|---|---|
| LiCl | 610 | 630 | 4.2 |
| $MgCl_2$ | 714 | 734 | 61 |
| $CaCl_2$ | 775 | 795 | 0.004 |
| NaCl | 801 | 821 | 60 |

As can be seen, from the perspective of minimizing salt evaporation, calcium is the best reducing metal, with lithium being second.

The process may be operated at as low a temperature as practically feasible to limit vapours of reducing metal. Vapours of reducing metals poses a danger in that it can react uncontrollably with $TiCl_4$ in the vapour phase causing runaway temperatures. The estimated vapour pressures of different reducing metals at 20° C. above the melting points of the respective salts are given in the Table 2.

TABLE 2

Metal Vapour Pressure at 20° C. Above Chloride Salt Melting Point

| Metal | Salt M.P. (CC) | M.P. + 20 (CC) | Pvap@ M.P. = 20° C. (Pa) |
|---|---|---|---|
| Li | 610 | 630 | 15.5 |
| Mg | 714 | 734 | 1527 |

TABLE 2-continued

Metal Vapour Pressure at 20° C. Above Chloride Salt Melting Point

| Metal | Salt M.P. (CC) | M.P. + 20 (CC) | Pvap@ M.P. = 20° C. (Pa) |
|---|---|---|---|
| Ca | 775 | 795 | 105 |
| Na | 801 | 821 | 50620 |

As can be seen, from the perspective of minimizing reducing metal evaporation, lithium is by far the best reducing metal with calcium being second.

DESCRIPTION OF AN EMBODIMENT OF THE INVENTION

The invention will now be discussed with reference to the illustrative diagrammatic block diagram which is not intended to limit the scope of the invention.

In the block flow diagram illustrating the titanium synthesis part of the CSIR-Ti process is shown in the figure above. In essence $TiCl_4$ is continuously reduced in two stages, firstly in a pre-reduction stage $TiCl_4$ is reacted with Ti to form titanium subchlorides dissolved in molten salt and a final reduction stage where the dissolved titanium subchloride is reacted with dissolved reducing metal to form titanium. The final reactor is operated as a CSTR. The final reactor can also be classified as a reactive crystallizer since the two dissolved reactants react rapidly in the reactor to form insoluble titanium particles.

Three streams exit the reactor. The first stream is passed to a reducing metal dissolution vessel where the reducing metal to be used is dissolved in the stream before recycling it to the final subchloride reduction reactor. Another stream containing part of the suspended titanium particles are passed to first stage $TiCl_4$ reduction reactor to partially reduce the $TiCl_4$ feed to the process. The final stream is quenched as it is removed from the reactor and then passed to downstream processes to separate the titanium product from the salt and to recover the salt (not shown).

The process is believed to overcome or reduce some or all of the following problems:

Blocking of $TiCl_4$ feed lines
Formation of titanium lumps on the reactor internals.
Growth of primary titanium particles that are on average larger than 5 micron. Smaller particles are not ideally suitable for powder metallurgy and the relative size of the passivating oxygen layer equates to high levels of oxygen contamination.
Sintering of titanium particles. Chloride levels are of significant importance in downstream processing; sintering may encapsulate salt and make the powder non-viable in many applications.
Corrosion of reactor internals.
Salt evaporation.
Evaporation of reducing metal.

The invention claimed is:

1. A process for the production of crystalline titanium powder containing single crystals or agglomerates of single crystals having an average crystal size (by volume) greater than 1 µm, said process including reacting a titanium chloride species, and reducing metal in a continuous back-mix reactor to produce a free flowing suspension of titanium powder in molten chloride salt wherein:

i. both the titanium chloride species and the reducing metal are dissolved in a molten chloride salt including suspended titanium powder and fed to the reactor containing a chloride salt of the reducing metal;

ii. the average feed ratio of the titanium chloride species and reducing metal to the continuous back-mix reactor is within 1% of the stoichiometric ratio required to fully reduce the titanium chloride salt to titanium metal;

iii. the concentration of titanium powder in the fluid suspension of titanium powder in molten salt in the continuous back-mix reactor is between 2 and 23 mass %; and iv. the reducing metal is lithium, sodium, magnesium, or calcium.

2. A process as claimed in claim 1, wherein some molten salt and titanium powder product is withdrawn together from the continuous back-mix reactor and they are separated from each other outside the reactor.

3. A process as claimed in claim 1, wherein the feed of the dissolved titanium chloride species is produced in a separate vessel external to the continuous back-mix reactor.

4. A process as claimed in claim 3, wherein the feed of the dissolved titanium chloride species is produced in a separate vessel external to the continuous back-mix reactor by reacting $TiCl_4$ with metallic titanium dispersed in molten chloride salt recycled from the continuous back-mix reactor.

5. A process as claimed in claim 1, wherein the reducing metal is pre-dissolved in molten chloride salt prior to feeding to the continuous back-mix reactor.

6. A process as claimed in claim 5, wherein the reducing metal is pre-dissolved in molten chloride salt prior to feeding to the continuous back-mix reactor by recycling molten salt from the continuous back-mix reactor to a vessel where the reducing metal is dissolved in the chloride salt.

7. A process as claimed in claim 1, wherein vessels to produce the dissolved titanium chloride salt and the dissolved reducing metal are electrically isolated from each other and also from the continuous back-mix reactor.

8. A process as claimed in claim 1, wherein the molar concentration of dissolved titanium cations of the titanium chloride salt is less than 25% of the molar concentration of chloride anions in the molten salt feed solution.

9. A process as claimed in claim 8, wherein the molar concentration of dissolved titanium cations of the titanium chloride salt is less than 5% of the molar concentration of chloride anions in the molten salt feed solution.

10. A process as claimed in claim 1, wherein the molar concentration of dissolved reducing metal atoms in the molten chloride salt feed is less than 3.5% of the chloride anions of the molten salt solution.

11. A process as claimed in claim 10, wherein, the molar concentration of dissolved reducing metal atoms in the molten chloride salt feed is less than 0.5% of the chloride anions of the molten salt solution.

12. A process as claimed in claim 1, wherein the feed of dissolved reducing metal to the continuous back-mix reactor is in excess of the stoichiometric requirement to reduce all the titanium sub-chloride in the feed to the continuous back-mix reactor.

13. A process as claimed in claim 1, wherein the temperature of the continuous back-mix reactor is less than 800° C.

14. A process as claimed in claim 13, wherein the temperature of the continuous back-mix reactor is less than 650° C.

15. A process as claimed in claim 1, wherein the residence time in said reactor is expressed as a ratio of the volume of titanium powder inside the continuous back-mix reactor to the volumetric rate of titanium powder produced in the continuous back-mix reactor, and is more than five minutes.

16. A process as claimed in claim 15, wherein the residence time in the reactor is expressed as a ratio of the volume of titanium powder inside the continuous back-mix reactor to the volumetric rate of titanium powder produced in the continuous back-mix reactor, and is more than twenty minutes.

17. A process as claimed in claim 1, wherein there is an excess of dispersed titanium recycled to the vessel producing the dissolved titanium halide species relative to the stoichiometric requirement to fully reduce $TiCl_4$ feed to titanium dichloride.

18. A process as claimed in claim 1, wherein the titanium chloride species is titanium dichloride.

19. A process as claimed in claim 1, wherein the average feed ratio of the titanium chloride species and reducing metal to the continuous back-mix reactor is within 0.1% of the stoichiometric ratio required to fully reduce the titanium chloride salt to titanium metal.

* * * * *